United States Patent
Park

(10) Patent No.: US 8,241,836 B2
(45) Date of Patent: Aug. 14, 2012

(54) METHOD OF FABRICATING A LINE PATTERN IN A PHOTORESIST LAYER BY USING A PHOTOMASK HAVING SLANTED UNIT PATTERNS

(75) Inventor: Chan Ha Park, Yongin-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 263 days.

(21) Appl. No.: 12/650,838

(22) Filed: Dec. 31, 2009

(65) Prior Publication Data

US 2010/0330465 A1   Dec. 30, 2010

(30) Foreign Application Priority Data

Jun. 29, 2009   (KR) .................. 10-2009-0058546

(51) Int. Cl.
  *G03F 7/20*   (2006.01)
(52) U.S. Cl. ........................................ 430/311
(58) Field of Classification Search ................... 430/311
  See application file for complete search history.

(56) References Cited

U.S. PATENT DOCUMENTS

| 6,632,744 B2 * | 10/2003 | Imai et al. ................. 430/394 |
| 7,459,265 B2 | 12/2008 | Ishibashi et al. |
| 7,572,558 B2 | 8/2009 | Matsuura |
| 2005/0003278 A1 * | 1/2005 | Hwang et al. ................ 430/5 |
| 2006/0088792 A1 * | 4/2006 | Ishibashi et al. ............ 430/394 |

FOREIGN PATENT DOCUMENTS

| JP | 2005-181516 A | 7/2005 |
| JP | 2008-249865 A | 10/2008 |
| JP | 4459607 | 2/2010 |

* cited by examiner

*Primary Examiner* — Mark F Huff
*Assistant Examiner* — John S Ruggles
(74) *Attorney, Agent, or Firm* — Marshall, Gerstein & Borun LLP

(57) ABSTRACT

A method of fabricating a line pattern extending in a first direction in a photoresist layer on a wafer by forming the photoresist layer on the wafer and implementing exposure on the wafer formed with the photoresist layer by using a photomask having a main pattern provided with a plurality of unit patterns slanted by a predetermined angle relative to the first direction and arranged along the first direction.

7 Claims, 16 Drawing Sheets

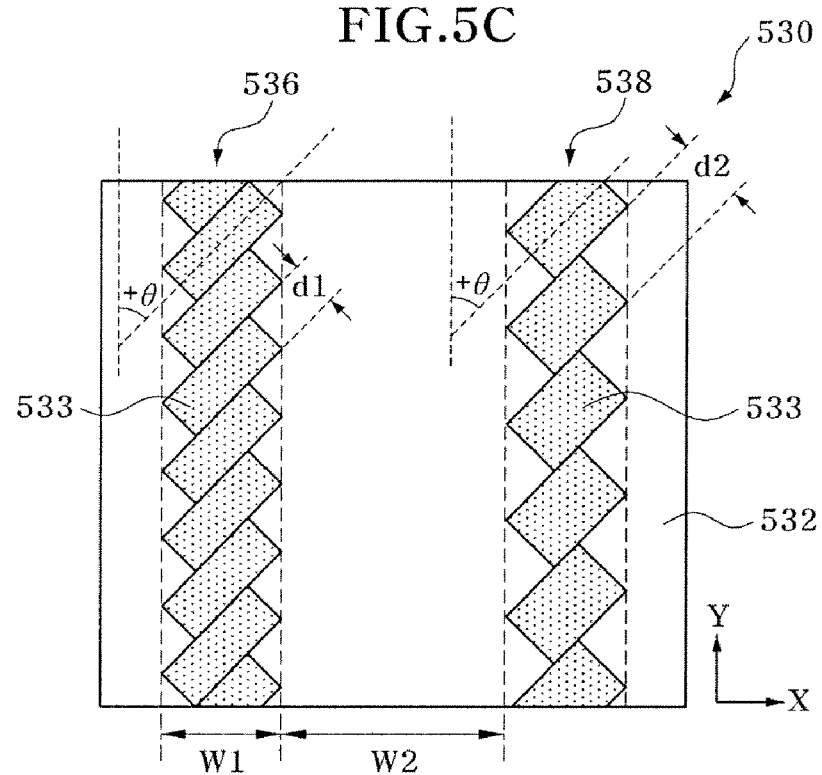
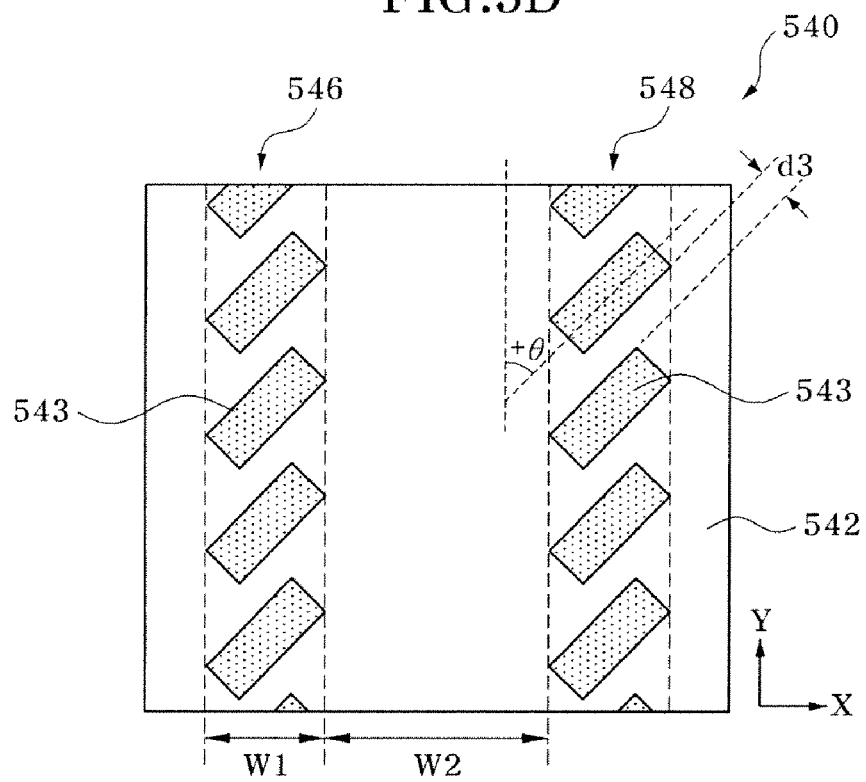

METHOD OF FABRICATING A LINE PATTERN IN A PHOTORESIST LAYER BY USING A PHOTOMASK HAVING SLANTED UNIT PATTERNS

CROSS-REFERENCE TO RELATED APPLICATIONS

Priority is claimed to Korean patent application number 10-2009-0058546, filed on Jun. 29, 2009, the disclosure of which is incorporated by reference in its entirety.

BACKGROUND

The disclosure relates generally to a photomask and a method of fabricating a pattern using the photomask, and, more particularly, to a photomask for forming a line pattern with a low density and a method of fabricating the pattern using the photomask.

As integration degree rapidly increases, limitations in photolithography technology for fabricating a pattern have reached a serious level. Accordingly, various methods have been developed to overcome the aforementioned limitations, and one of which is to use an off-axis illumination system or an asymmetric illumination system.

FIG. 1 is a layout diagram illustrating a photoresist layer pattern for forming a line/space-type gate pattern as an example of a pattern for a semiconductor device. As illustrated in FIG. 1, to form a line/space-type gate pattern, an exposure and development process by photolithography technology is first implemented to form photoresist layer patterns 101, 102. Next, an etch process on an exposed portion of a lower layer 111, 112 is implemented using the photoresist layer patterns 101, 102 as an etch mask to form gate patterns corresponding to the photoresist layer patterns 101, 102. In general, in a semiconductor device having a cell region and a peripheral region, and particularly in a dynamic random access memory (DRAM) device, the gate patterns are arranged with a narrow spacing between two adjacent gate patterns in an X-axis direction in the cell region CELL, whereas the gate patterns are arranged with a wide spacing between two adjacent gate patterns in an X-axis direction in the peripheral region PERI.

FIG. 2 illustrates a dipole illumination system, which is an example of an off-axis illumination system used in an exposure process for forming the photoresist layer patterns of FIG. 1 and an example of an intensity distribution of light transmitted through a photomask. As illustrated in FIG. 2, a dipole illumination system 210 has light transmitting parts arranged symmetrically in an X-axis direction. When implementing the exposure using this dipole illumination system 210, in the cell region, as shown in the graph 220, a difference between an intensity of light transmitted through a light shielding region 231 of the photomask 230 and an intensity of light transmitted through a light transmitting region 232 is significant in the X-axis direction, and a high resolution in the X-axis direction can thus be obtained.

However, in the peripheral region PERI having a relatively low density or an isolated shape, a zeroth order diffraction light and a first order diffraction light transmitted through the photomask are not symmetrical any more. Therefore, because slight variations in a process variable, such as a focus offset, have a large influence on a pattern profile, a pattern collapse as indicated by 310 and 320 in FIGS. 3A and 3B, respectively, may be generated in extreme conditions.

This will be described with reference to FIGS. 4A through 4C which illustrate symmetry of light according to a density of the pattern. First, as illustrated in FIG. 4A, when a pitch is smallest, for example, when the pitch (denoted as "P" in FIG. 1) is 150 nm, zeroth order lights 411, 431, a negative first order light 421 and a positive first order light 441 forms a suitable symmetrical structure. In particularly, the negative first order light 421 and the zeroth order light 431, which should interfere with each other, are arranged generally symmetrically along an X-axis direction. On the other hand, as illustrated in FIG. 4B, when the pitch P is increased to 200 nm, the negative first order light 421 and the positive first order light 441 are moved toward the middle, and, thus, the negative first order light 421 and the zeroth order light 431, which should interfere with each other, show a degraded symmetry along the X-axis direction.

Furthermore, as illustrated in FIG. 4C, when the pitch P is increased to 300 nm, the negative first order light 421 and the positive first order light 441 are moved to the middle, and, thus, the negative first order light 421 and the zeroth order light 431, which should interfere with each other, are not symmetrical with each other anymore along the X-axis direction.

As described above, when implementing the exposure for forming a line-type pattern (101, 102 of FIG. 1) using an asymmetric illumination system having directivity such as a dipole illumination system (210 of FIG. 2), a sufficient resolution along the X-axis direction is obtained and the profile of the patterns 101, 102 is not easily changed by the variation in the process variable such as the focus offset in the cell region CELL having a high pattern density. However, in the peripheral region PERI having a low pattern density, the symmetry of the zeroth order light 431 and the negative first order light 421 is degraded and the profile of the patterns 101, 102 is changed even with a slight variation in the process variable, such as the focus offset, thereby resulting in the generation of pattern collapse.

SUMMARY

Examples of a photomask used upon exposure for formation of a line-type pattern using an asymmetric illumination system, of which layout is changed to minimize change of a pattern profile due to a process variable, such as a focus offset in a region having a low pattern density, and a method of fabricating the pattern using the photomask is disclosed herein.

In one aspect, a photomask for forming a line-type pattern extending in a first direction includes a light transmitting substrate, and a main pattern corresponding to the line-type pattern provided with a plurality of unit patterns slanted relative to the first direction by a predetermined angle and arranged on the light transmitting substrate along the first direction.

Each unit pattern may be spaced apart from an adjacent unit pattern with a predetermined spacing along the first direction. Alternatively, each unit pattern may be in contact with an adjacent unit pattern along the first direction.

A spacing between adjacent main patterns may be at least three times a critical dimension of the main pattern.

The unit pattern of the main pattern may be slanted in an angle opposite that of a unit pattern of an adjacent main pattern.

The unit pattern of the main pattern may have a thickness which is different from a thickness of a unit pattern of an adjacent main pattern.

In another aspect, a method of fabricating a line-type photoresist layer pattern extending in a first direction on a wafer includes forming a photoresist layer on the wafer, implementing exposure on the wafer formed with the photoresist layer using a photomask having a main pattern provided with a plurality of unit patterns slanted relative to the first direction by a predetermined angle and arranged along the first direction.

Implementing of the exposure may include utilizing an asymmetric illumination system. The asymmetric illumination system may employ a dipole illumination system having light transmitting parts which are symmetrical with each other in a second direction perpendicular to the first direction.

The photomask may include a structure where adjacent unit patterns along the first direction are spaced apart from each other.

Alternatively, the photomask may include a structure adjacent unit patterns along the first direction are in contact with each other.

A spacing between adjacent photoresist layer patterns may be at least three times a critical dimension of the photoresist layer pattern.

The unit pattern of the main pattern may be slanted in an angle opposite that of a unit pattern of an adjacent main pattern.

The unit pattern of the main pattern may have a thickness which is different from a thickness of a unit pattern of an adjacent main pattern.

Because a main pattern of a photomask is formed by arranging a plurality of unit patterns slanted to a direction in which a pattern to be formed extends by a predetermined angle, the characteristics of directivity are mixed with implementing an exposure process using an asymmetric illumination system, and, thus, change in a pattern profile due to a process variable, such as a focus offset, may be minimized even in a region having low pattern density.

BRIEF DESCRIPTION OF THE DRAWINGS

FIGS. 5A through 5D are layouts illustrating examples of a photomask for forming a line-type pattern;

DETAILED DESCRIPTION

An example of a photomask for forming a line-type pattern and a method of fabricating the pattern using the photomask will be described in detail with reference to the accompanying drawings.

FIGS. 5A through 5D are layouts illustrating examples of a photomask for forming a line-type pattern.

Figure 5A:
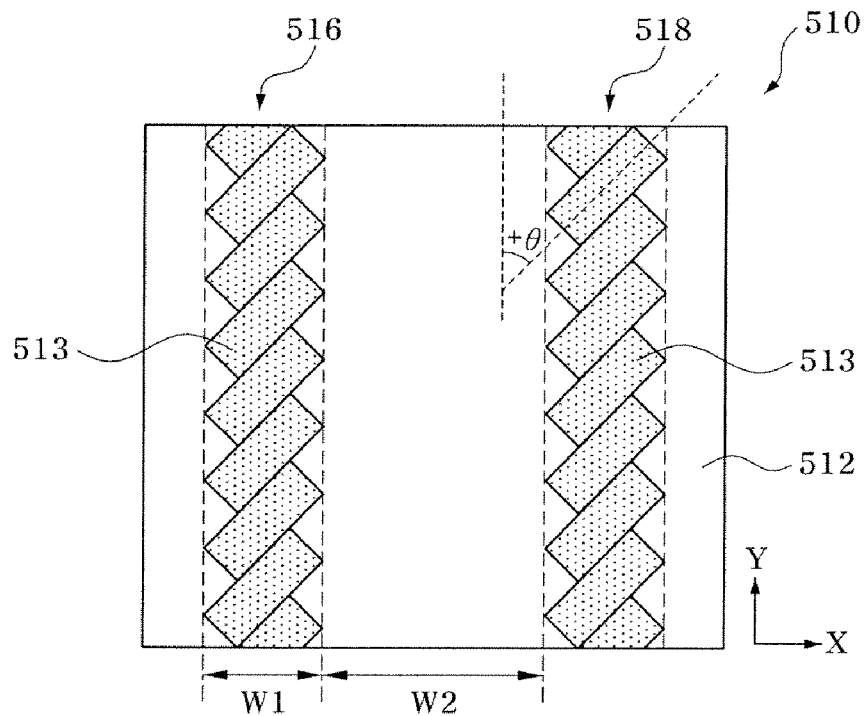

Referring first to FIG. 5A, an example of a photomask 510 includes main patterns 516, 518 arranged on a light transmitting substrate 512 such as quartz. Because the photoresist layer pattern to be formed is a line-type pattern (i.e., a pattern which extends along a Y-axis direction and is spaced apart from an adjacent pattern in an X-axis direction), the main patterns 516, 518 of the photomask 510 have a layout corresponding to this photoresist layer pattern. Accordingly, the main patterns 516, 518 of the photomask 510 have a layout in which they extend along the Y-axis direction and are spaced apart from each other with a predetermined spacing W2 in the X-axis direction. A density of the main patterns 516, 518 in the X-axis direction is low, and in one example, a ratio of the critical dimension W1 of the main patterns 516, 518 to the spacing W2 between the main patterns 516, 518 is at least 1:3.

The main patterns 516, 518 include unit patterns 513, which are arranged in a direction slanted relative to the Y-axis direction by a predetermined angle (+θ). Although the unit pattern 513 is illustrated in a rectangular shape in the figure, this is illustrative only and the shape of the unit pattern 513 is not limited thereto. The unit pattern 513 slanted with a positive angle (+θ) is in contact with adjacent unit patterns 513 at the side faces thereof, and, as the result, the main patterns 516, 518 extending along the Y-axis direction are formed. The unit pattern 513 constituting the main patterns 516, 518 may be a light shielding layer pattern such as a chromium (Cr) layer or a phase shift layer pattern such as a molybdenum silicon nitride (MoSiN), but the unit patterns 513 are not limited thereto.

Figure 5B:
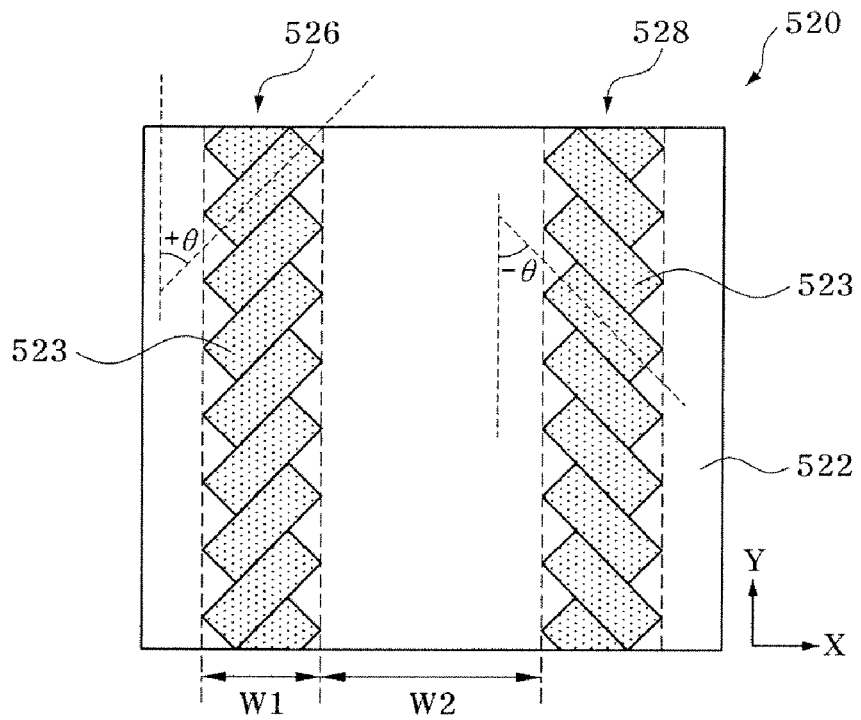

Referring next to FIG. 5B, a further example of a photomask 520 includes main patterns 526, 528 arranged on a light transmitting substrate 522. The main patterns 526, 528 of the photomask 520 have a layout in which they extend along the Y-axis direction and are spaced apart from each other with a predetermined spacing W2 in the X-axis direction. The density of the main patterns 526, 528 in the X-axis direction is low, and, in one example, the ratio of the critical dimension W1 of the main patterns 526, 528 to the spacing W2 between the main patterns 526, 528 is at least 1:3. The main pattern 526 includes unit patterns 523, which are arranged in a direction slanted relative to the Y-axis direction by a predetermined positive angle (+θ), whereas the main patterns 528 include unit patterns 523', which are arranged in a direction slanted relative to the Y-axis direction by a predetermined negative angle (−θ). The unit pattern 523 slanted with the positive angle (+θ) is in contact with adjacent unit patterns 523 at side faces thereof, and, as the result, the main pattern 526 extending along the Y-axis direction is formed. Likewise, the unit pattern 523' slanted with a negative angle (−θ) is in contact with adjacent unit patterns 523' at side faces thereof, and, as the result, the main pattern 528 extending along the Y-axis direction is formed. The unit patterns 523 constituting the main pattern 526 and the unit pattern 523' constituting the main pattern 528 generally have the same shape, except for the slant angle. The unit patterns 523, 523' may be a light shielding layer pattern such as a chromium (Cr) layer or a phase shift layer pattern such as a molybdenum silicon nitride (MoSiN), but the unit patterns 523, 523' are not limited thereto.

Referring next to FIG. 5C, another example of a photomask 530 includes main patterns 536, 538 arranged on a light transmitting substrate 532. The main patterns 536, 538 of the photomask 530 have a layout in which they extend along the Y-axis direction and are spaced apart from each other with a predetermined spacing W2 in the X-axis direction. the density of the main patterns 536, 538 in the X-axis direction is low, and, in one example, the ratio of the critical dimension W1 of the main patterns 536, 538 to the spacing W2 between the main patterns 536, 538 is at least 1:3. The main pattern 536 includes unit patterns 533, which are arranged in a direction slanted relative to the Y-axis direction by a predetermined positive angle (+θ), and the unit pattern 533 has a relatively thin first thickness d1. The main pattern 538 includes unit patterns 533', which are arranged in a direction slanted relative to the Y-axis direction by a predetermined positive angle (+θ), but the unit pattern 533' has a second thickness d2 which is relatively thicker than the first thickness d1 of the unit pattern 533. The unit patterns 533/533' slanted with a positive angle (+θ) are in contact with adjacent unit patterns 533/533' at side faces thereof, and, as the result, the main patterns 536/538 extending along the Y-axis direction are formed. The unit patterns 533/533' constituting the main patterns 536/538, may be a light shielding layer pattern such as a chromium (Cr) layer or a phase shift layer pattern such as a molybdenum silicon nitride (MoSiN), but not limited thereto. Though not shown in the figure, either of the unit patterns 533 constituting the main pattern 536 or unit patterns 533' constituting the main pattern 538 may be arranged having a negative angle (−θ) as described with reference to FIG. 5B.

Referring next to FIG. 5D, yet another example of a photomask 540 includes main patterns 546, 548 arranged on a light transmitting substrate 542. The main patterns 546, 548 have a layout in which they extend along the Y-axis direction and are spaced apart from each other with a predetermined spacing W2 in the X-axis direction. The density of the main patterns 546, 548 in the X-axis direction is low, and, in one example, the ratio of the critical dimension W1 of the main patterns 546, 548 to the spacing W2 between the main patterns 546, 548 is at least 1:3. The main patterns 546, 548 include unit patterns 543, which are arranged in a direction slanted relative to the Y-axis direction by a predetermined angle (+θ). The unit pattern 543 slanted with a positive angle (+θ) is spaced apart from adjacent unit patterns 543, and, as the result, the main patterns 546, 548 extending along the Y-axis direction are formed. In the photomask 540, because the unit patterns 543 are spaced apart from each other in the Y-axis direction as compared to the photomasks 510, 520, 530 described with reference to FIGS. 5A through 5C, the finally formed photoresist layer pattern is formed to a shape having waved edges along the Y-axis direction. Though not shown in the figure, either of the unit pattern 543 constituting the main pattern 546 or the unit pattern 543 constituting the main pattern 548 may be arranged having a negative angle (−θ), and may have a relatively greater thickness.

Figure 1:
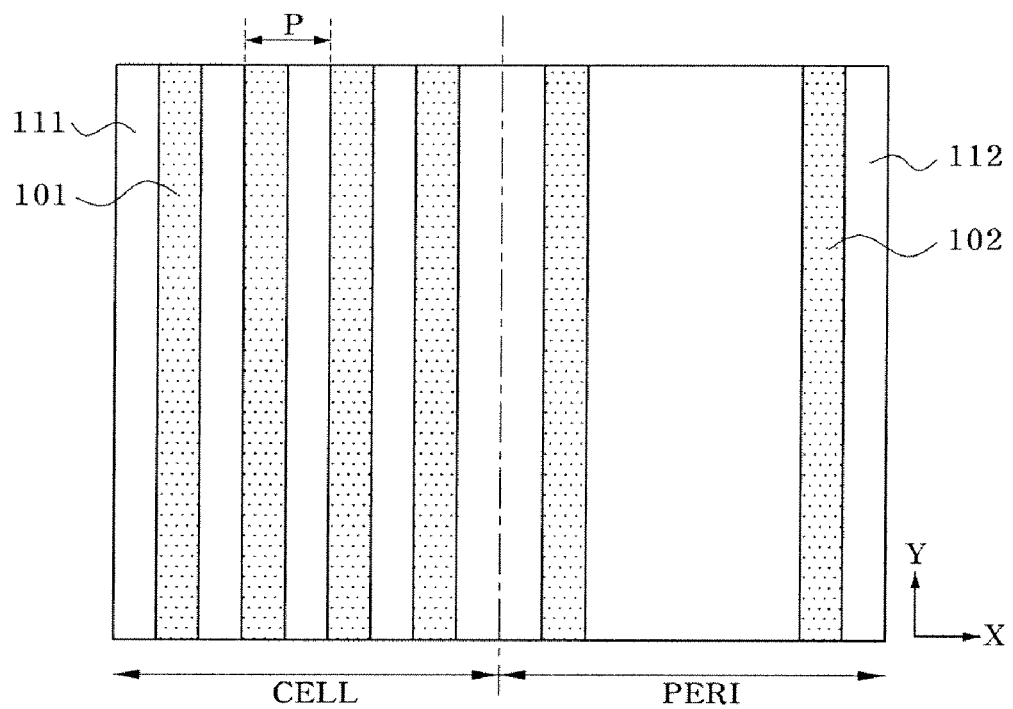
FIG. 1 is a layout diagram illustrating a photoresist layer pattern for forming a line/space-type gate pattern as an example of a pattern constituting a semiconductor device of the prior art.
Figure 2:
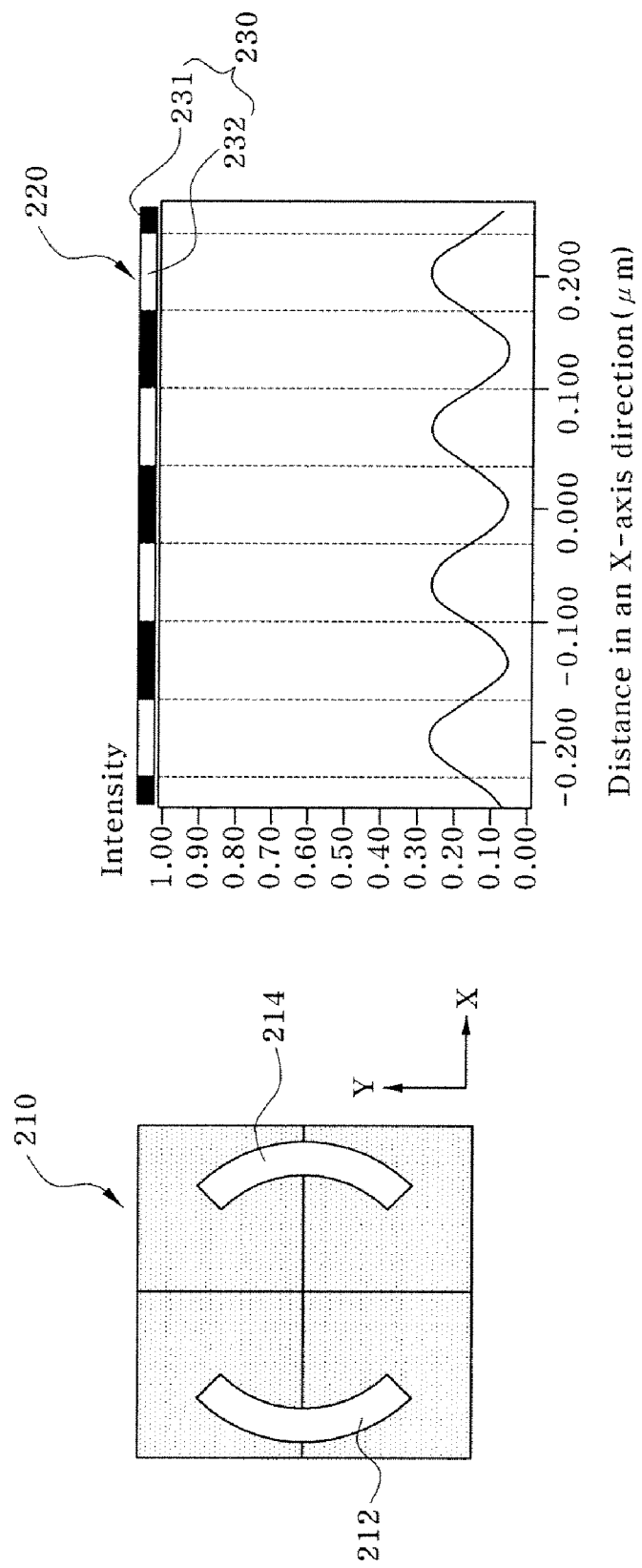
FIG. 2 illustrates a dipole illumination system, an example of an off-axis illumination system used in an exposure for forming the photoresist layer patterns of FIG. 1 and an intensity distribution of light transmitted through a photomask according to the prior art.
Figure 3A:
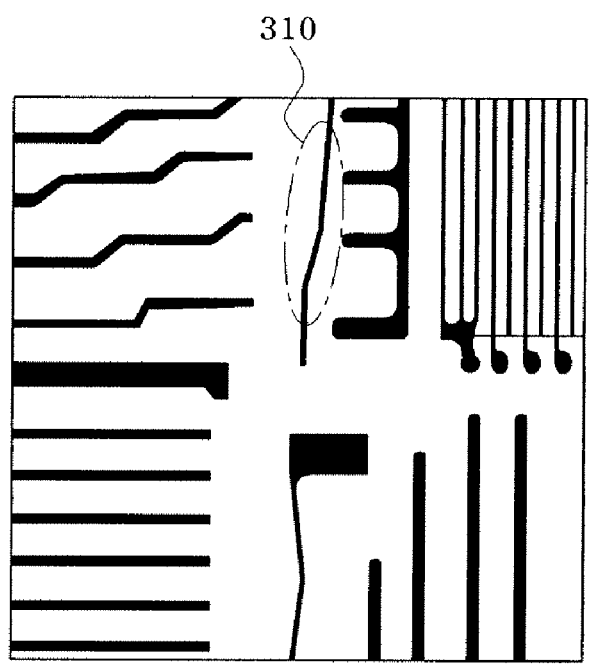
FIGS. 3A and 3B are diagrams illustrating pattern collapse in a peripheral region according to the prior art.
Figure 3B:
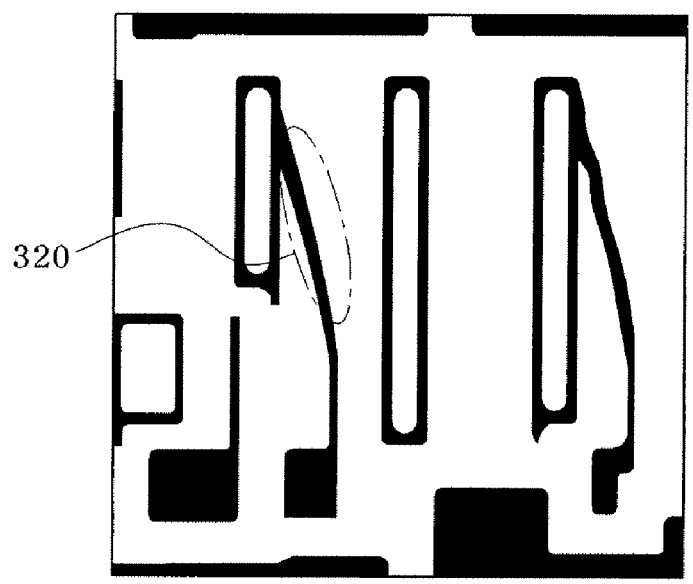
Figure 4A:
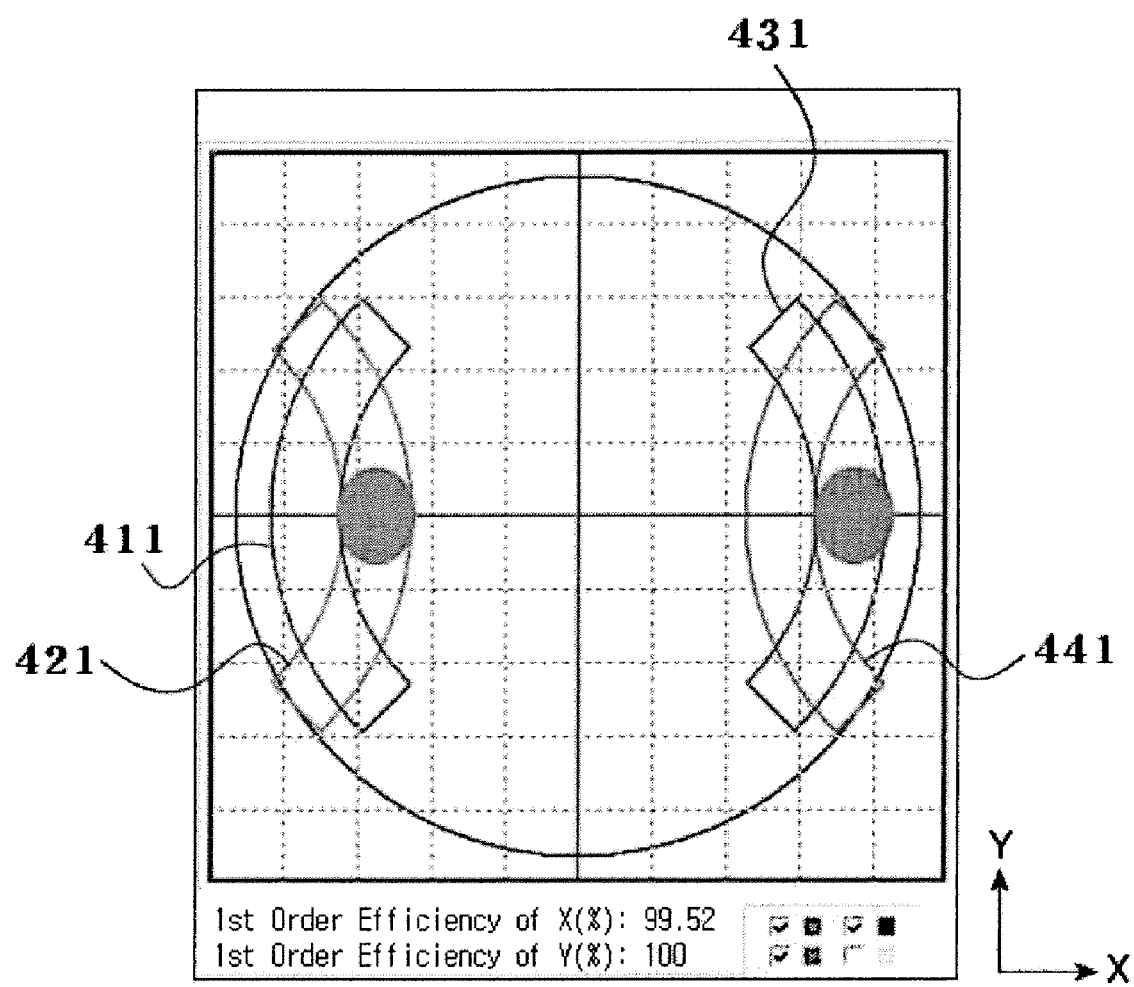
FIGS. 4A through 4C illustrate symmetry of light according to a pattern density according to the prior art.
Figure 4B:
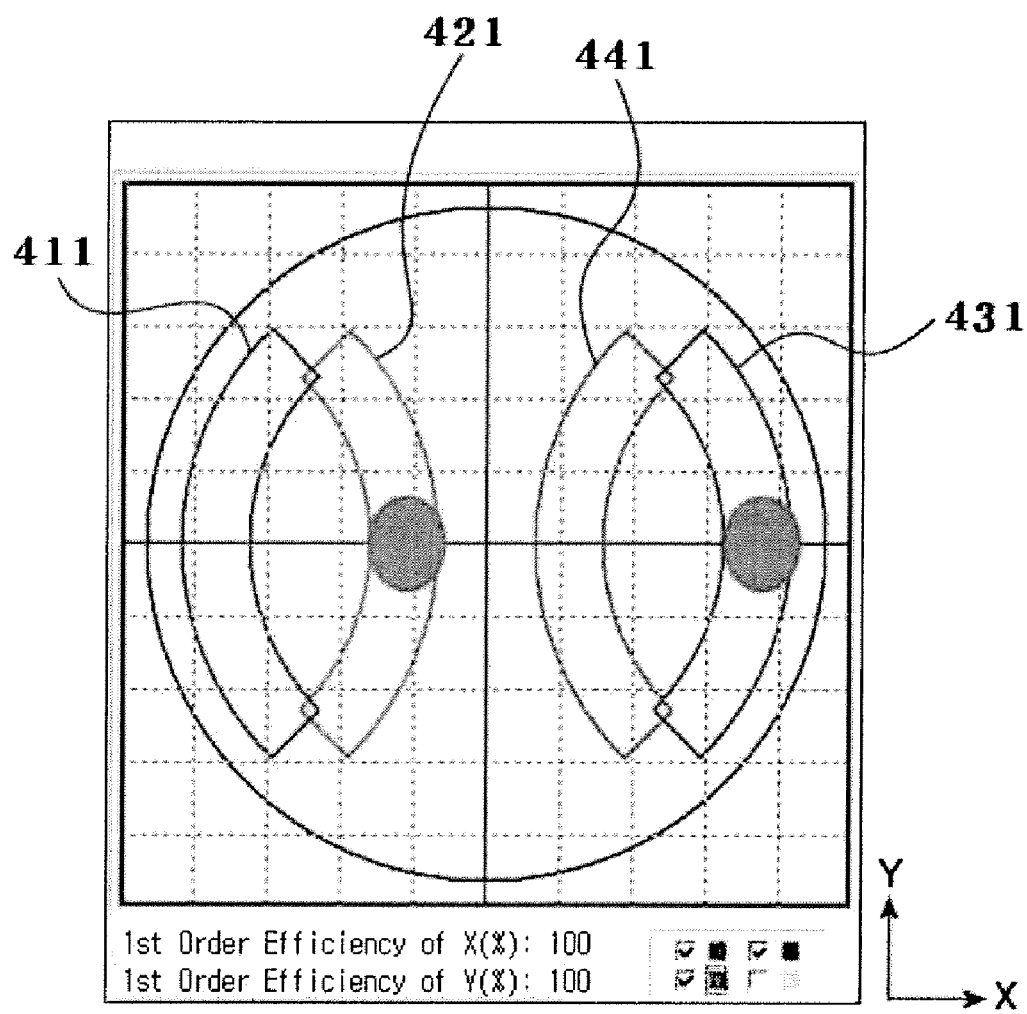
Figure 4C:
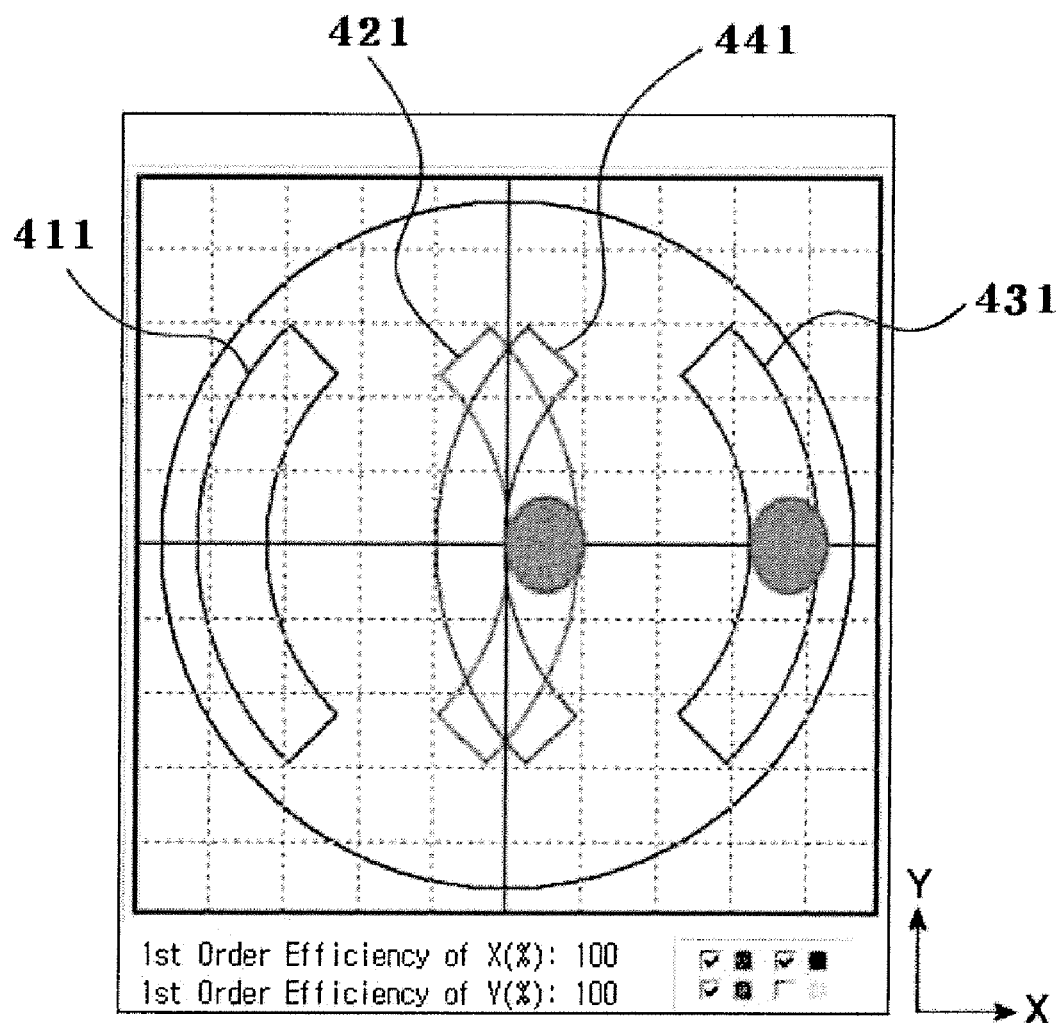

To form a line-type photoresist layer pattern using the photomasks 510, 520, 530, 540, a photoresist layer is first formed on a wafer using, for example, a spin coating. Next, the wafer formed with the photoresist layer is loaded into exposure equipment. After that, an exposure is implemented within the exposure equipment using one of the photomasks 510, 520, 530, 540 and a dipole illumination system (210 of FIG. 2). Next, a development is implemented on the exposed photoresist layer to form the photoresist layer pattern.

When implementing the exposure on the photomasks 510, 520, 530, 540 described above using an asymmetric illumination system, such as a dipole illumination system, the depth of focus is not reduced even though the pattern density in the X-axis direction is low, and any defect of pattern profile, such as pattern collapse, is not generated even though a process margin such as a focus offset is changed. The principle behind using the photomasks of FIGS. 5A through 5D for implementing an exposure on a photoresist layer using a dipole illumination system will now be described in detail with reference to FIGS. 6A through 6C and 7A through 7C.

Figure 6A:
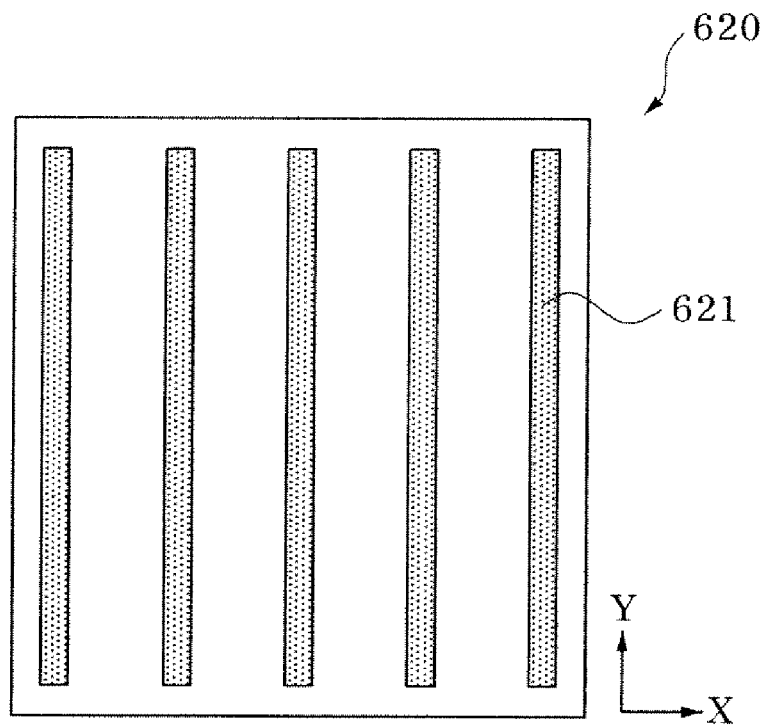
FIGS. 6A through 6C and 7A through 7C illustrate the principle behind using the photomasks of FIGS. 5A through 5D for implementing an exposure on a photoresist layer using a dipole illumination system.
Figure 6B:
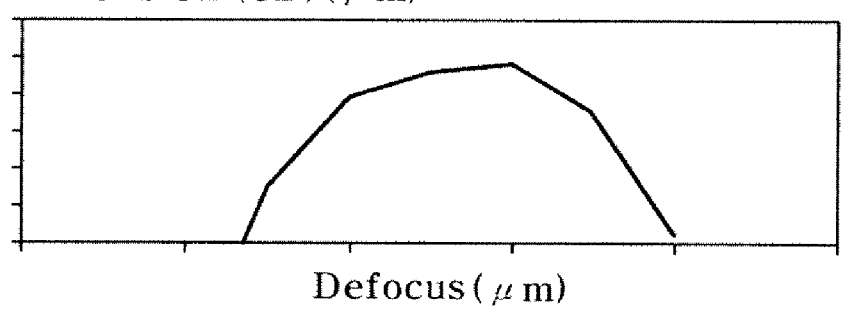
Figure 6C:
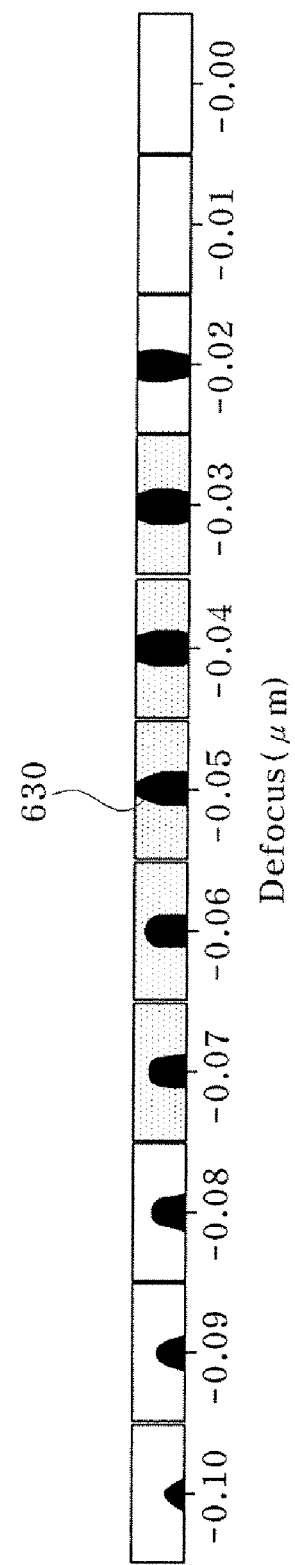

First, referring to FIGS. 6A through 6C, the photoresist layer on the wafer using the dipole illumination system (210 of FIG. 2) has light transmitting parts symmetrical with each other in the X-axis direction. The photomask (620 of FIG. 6A) has the main pattern 621, which is arranged spaced apart from each other with a low density in the X-axis direction and extends long in the Y-axis direction. When implementing an exposure on the photoresist layer on the wafer using the dipole illumination system (210 of FIG. 2) and using the photomask (620 of FIG. 6A) having the main pattern 621, distribution of the defocus in a horizontal axis shows a narrow width, as illustrated in FIG. 6B, and variation in the critical direction according to variation in the focus offset is significant. Referring to FIG. 6C illustrating a sectional structure of the formed photoresist layer pattern 630, it is found that the photoresist layer pattern 630 cannot have a normal profile when the defocus is lowered to less than −0.007 or increased more than −0.003.

Figure 7A:
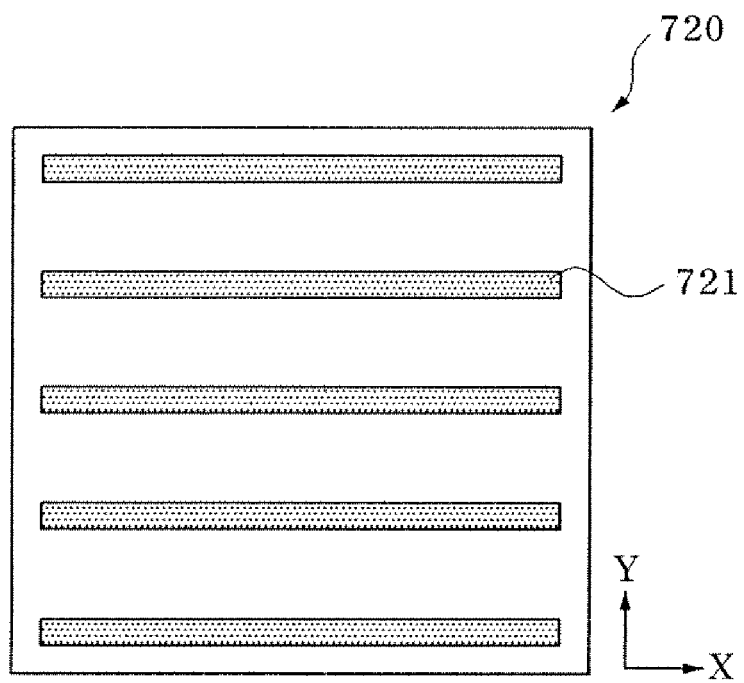
Figure 7B:
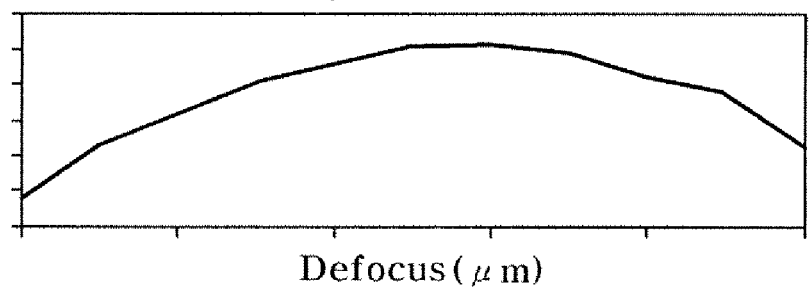
Figure 7C:
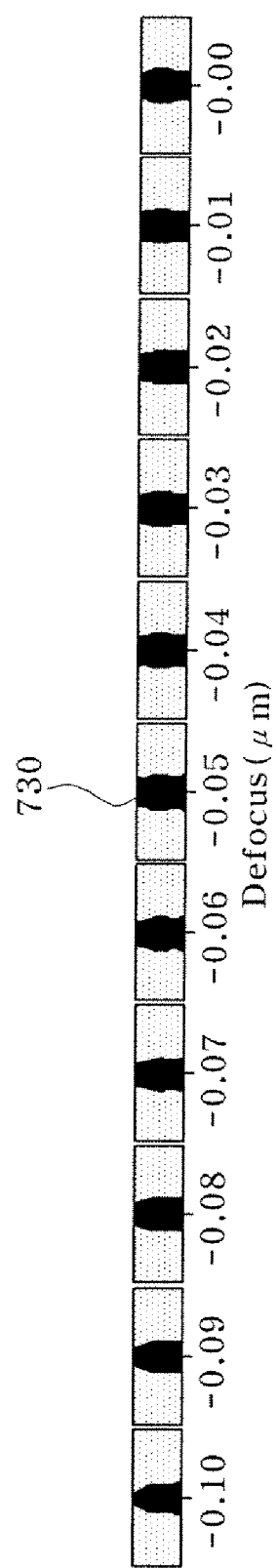

Next, referring to FIGS. 7A through 7C, when implementing an exposure on the photoresist layer on the wafer using the same dipole illumination system (210 of FIG. 2) but using the photomask (721 of FIG. 6A) having the main pattern (720 of FIG. 7A) which is arranged spaced apart from each other with a low density in the Y-axis direction and extends long in the X-axis direction, distribution of the defocus in a horizontal axis shows a relatively wide width, as illustrated in FIG. 7B. This means that variation in the critical direction according to variation in the focus offset is relatively small. Referring to FIG. 7C illustrating a sectional structure of the formed photoresist layer pattern 730, it is found that the profile of the photoresist layer pattern 730 is usually normal even when the defocus is lowered to less than −0.10 or increased more than −0.00.

This result is caused, because in the photomask 620 of FIG. 6A the density of the main pattern 621 in the X-axis direction is low, the symmetry of the refraction lights is broken and the pattern profile is affected by the variation in the defocus. However, in the photomask 720 of FIG. 7A, because the main pattern 721 has a layout extending along the X-axis direction, the dipole illumination system (210 of FIG. 2) has a small influence on the photomask 720 in the X-axis direction, and, as a result, the pattern profile is not easily affected by the variation in the defocus. However, in the disclosed photomask, as the main pattern is formed with the unit pattern (513 of FIG. 5; 523, 523' of FIG. 5B; 533, 533' of FIG. 5C; 543 of FIG. 5D) having a layout slant with a predetermined angle (+θ or −θ), a component of the photomask 620 of FIG. 6A is mixed with a component of the photomask 720 of FIG. 7A which is insensitive to the variation in the focus offset. As the result, there is shown, as a whole, that changes in the profile, such as a pattern critical dimension, according to the variation in the focus offset becomes smaller.

Figure 8A:
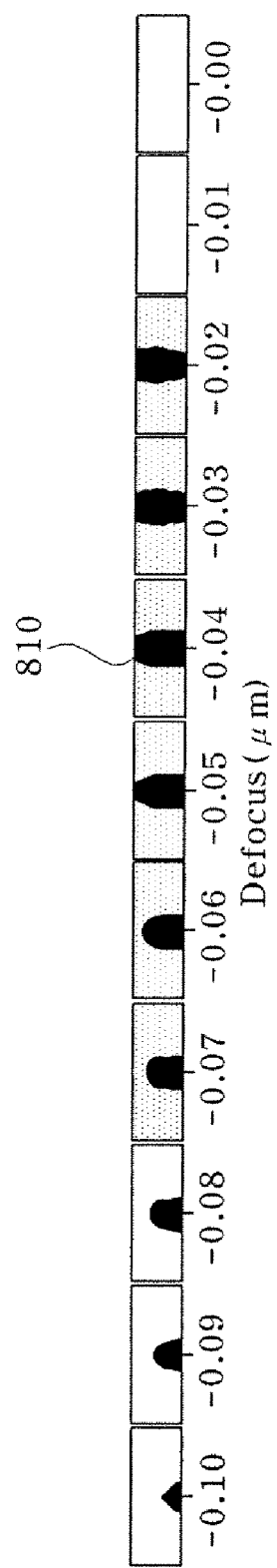
FIGS. 8A through 8C illustrate a comparison of distributions in a profile of the photoresist layer pattern formed by the photomask of FIGS. 5A through 5D and distributions in a profile of a conventional photomask.
Figure 8B:
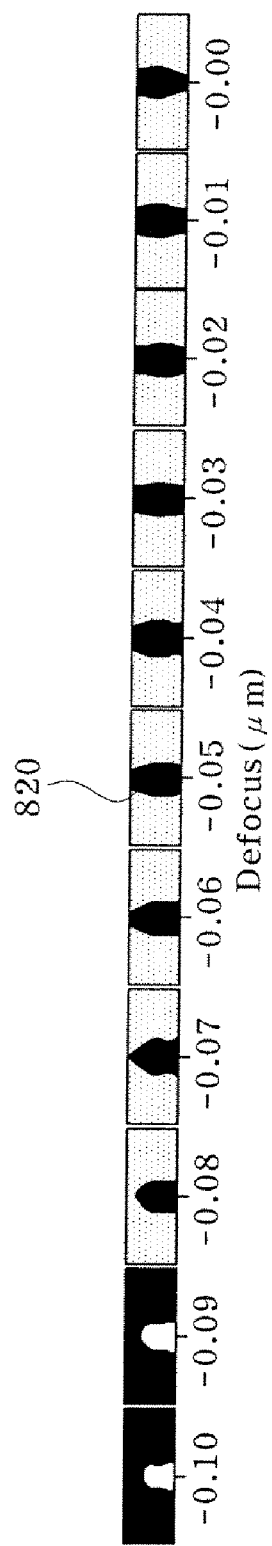
Figure 8C:
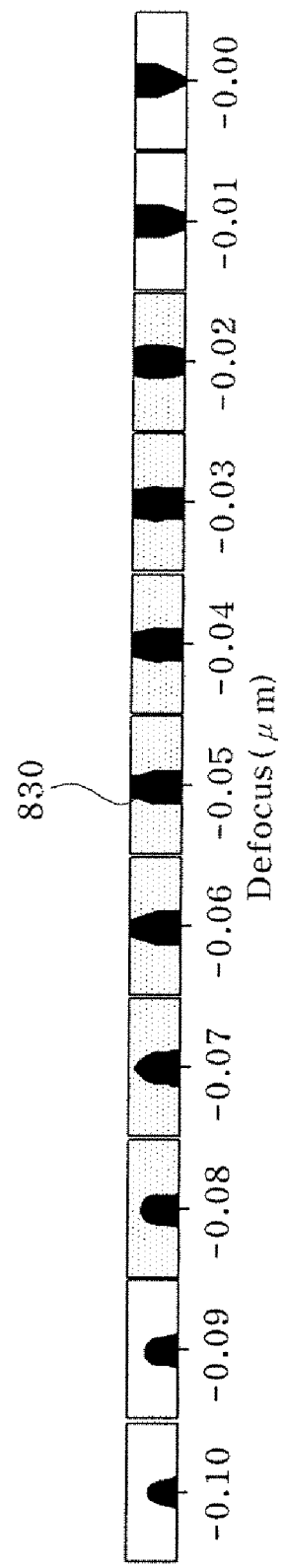

FIGS. 8A through 8C illustrate a comparison of distributions in a profile of the photoresist layer pattern formed by the photomask of FIGS. 5A through 5D and distributions in a profile of a conventional photomask. Specifically, FIG. 8A illustrates distribution in the profile of the photoresist layer pattern 810 when implementing exposure and development using a conventional photomask (e.g., the photomask 620 shown in FIG. 6A) and the dipole illumination system (210 of FIG. 2). FIG. 8B illustrates distribution in the profile of the photoresist layer pattern 820 when implementing exposure and development using the photomask 540 shown in FIG. 5D and the dipole illumination system (210 of FIG. 2). Also, FIG. 8C illustrates distribution in the profile of the photoresist layer pattern 830 when implementing exposure and development using the photomask 510 shown in FIG. 5A and the dipole illumination system (210 of FIG. 2). From the comparison of profile distributions of FIGS. 8A, 8B and 8C, it can be seen that change in the profile of the photoresist layer pattern 810 according to variation in the defocus is significant in FIG. 8A, whereas change in the profile of the photoresist layer pattern 820/830 according to variation in the defocus is relatively small in FIGS. 8B and 8C.

Figure 9A:
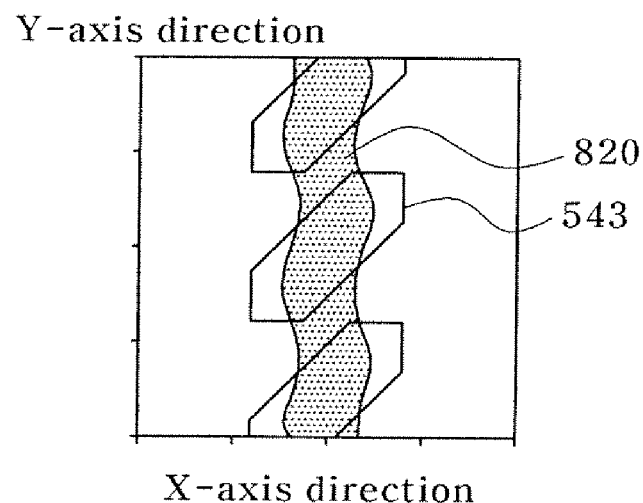
FIGS. 9A and 9B are plan views illustrating photoresist layer patterns formed using the photomask of FIGS. 5A through 5D.
Figure 9B:
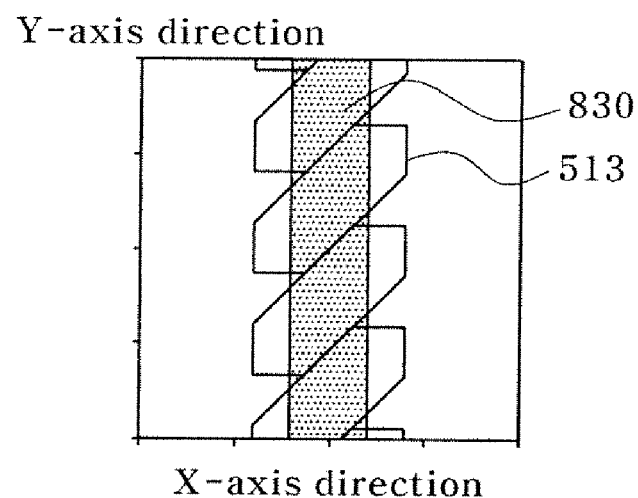

FIGS. 9A and 9B are plan views illustrating photoresist layer patterns formed using the photomask of FIGS. 5A through 5D. Specifically, FIG. 9A is a plan view illustrating the photoresist layer pattern 820 formed using the photomask 540 of FIG. 5D and the dipole illumination system (210 of FIG. 2), and FIG. 9B is a plan view illustrating the photoresist layer pattern 830 formed using the photomask 510 of FIG. 5A and the dipole illumination system (210 of FIG. 2). In FIG. 9A, the photoresist layer pattern 820 is formed with a profile having waved edges along the Y-axis direction, and in FIG. 9B, the photoresist layer pattern 830 is formed with a profile having straight linear edges along the Y-axis direction. The aforementioned difference is caused as the unit patterns 543 are spaced apart from each other in the Y-axis direction in FIG. 9A whereas the unit patterns 513 are in contact with each other in the Y-axis direction in FIG. 9B, and they can be suitably employed to form the photoresist layer pattern of a profile required in an application or design field.

While the present invention has been described with respect to the specific embodiments, it will be apparent to those skilled in the art that various changes and modifications may be made without departing from the spirit and scope of the invention as defined in the following claims.

What is claimed is:

1. A method of fabricating a line pattern extending in a first direction in a photoresist layer on a wafer, comprising:
    forming the photoresist layer on the wafer; and
    implementing exposure on the wafer formed with the photoresist layer by using a photomask having a main pattern provided with a plurality of unit patterns slanted by a predetermined angle relative to the first direction and arranged along the first direction wherein a spacing between adjacent photoresist layer patterns is at least three times a critical dimension of each of the adjacent photoresist layer patterns.

2. The method of claim 1, wherein implementing exposure comprises utilizing an asymmetric illumination system.

3. The method of claim 2, wherein the asymmetric illumination system employs a dipole illumination system having light transmitting parts which are symmetrical with each other in a second direction perpendicular to the first direction.

4. The method of claim 1, wherein the photomask comprises a structure wherein adjacent unit patterns along the first direction are spaced apart from each other.

5. The method of claim 1, wherein the photomask comprises a structure wherein adjacent unit patterns along the first direction are in contact with each other.

6. The method of claim 1, wherein each of the unit patterns of the main pattern is slanted at an angle opposite to that of a unit pattern of an adjacent main pattern.

7. The method of claim 1, wherein each of the unit patterns of the main pattern has a width which is different from a width of a unit pattern of an adjacent main pattern.

\* \* \* \* \*